US010913873B2

(12) United States Patent
Gopalan et al.

(10) Patent No.: US 10,913,873 B2
(45) Date of Patent: Feb. 9, 2021

(54) BLOCK COPOLYMERS WITH HIGH FLORY-HUGGINS INTERACTION PARAMETERS FOR BLOCK COPOLYMER LITHOGRAPHY

(71) Applicant: Wisconsin Alumni Research Foundation, Madison, WI (US)

(72) Inventors: Padma Gopalan, Madison, WI (US); Daniel Patrick Sweat, Madison, WI (US); Xiang Yu, Skokie, IL (US); Myungwoong Kim, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 451 days.

(21) Appl. No.: 15/404,775

(22) Filed: Jan. 12, 2017

(65) Prior Publication Data
US 2017/0121555 A1 May 4, 2017

Related U.S. Application Data

(62) Division of application No. 14/048,766, filed on Oct. 8, 2013, now Pat. No. 9,587,136.

(51) Int. Cl.
| | |
|---|---|
| *C09D 153/00* | (2006.01) |
| *C08F 297/02* | (2006.01) |
| *C08F 12/22* | (2006.01) |
| *C08F 12/32* | (2006.01) |
| *G03F 7/00* | (2006.01) |
| *C08F 297/04* | (2006.01) |
| *C09D 153/02* | (2006.01) |

(52) U.S. Cl.
CPC ............ *C09D 153/00* (2013.01); *C08F 12/22* (2013.01); *C08F 12/32* (2013.01); *C08F 297/02* (2013.01); *C08F 297/026* (2013.01); *C08F 297/046* (2013.01); *C09D 153/02* (2013.01); *G03F 7/0002* (2013.01); *Y10T 428/268* (2015.01)

(58) Field of Classification Search
CPC ........ C08F 12/22; C08F 12/32; C08F 297/02; C08F 297/026; C08F 297/046; C09D 153/00; C09D 153/02; G03F 7/0002; Y10T 428/268
See application file for complete search history.

(56) References Cited

U.S. PATENT DOCUMENTS

| | | | |
|---|---|---|---|
| 2009/0311363 A1* | 12/2009 | Dobisz | B82Y 10/00 425/470 |
| 2012/0046415 A1* | 2/2012 | Millward | C08F 287/00 525/105 |
| 2014/0187054 A1* | 7/2014 | Park | H01L 21/02118 438/781 |

OTHER PUBLICATIONS

Bates, F.S. Annu. Rev. Phys. Chem. 1990. 41: 525-57.*
Sinturel et al., High X-Low N Block Polymers: How Far Can We Go? ACS Macro Letters 2015, 4, Sep. 2, 2015, pp. 1044-1050.

* cited by examiner

*Primary Examiner* — James M Mellott
(74) *Attorney, Agent, or Firm* — Bell & Manning, LLC; Michelle Manning (57) ABSTRACT

Block copolymers for use in block copolymer lithography, self-assembled films of the block copolymers and methods for polymerizing the block copolymers are provided. The block copolymers are characterized by high Flory-Huggins interaction parameters ($\chi$). The block copolymers can be polymerized from protected hydroxystyrene monomers or from tert-butyl styrene and 2-vinylpyridine monomers.

16 Claims, 4 Drawing Sheets

BLOCK COPOLYMERS WITH HIGH FLORY-HUGGINS INTERACTION PARAMETERS FOR BLOCK COPOLYMER LITHOGRAPHY

CROSS-REFERENCE TO RELATED APPLICATIONS

The present application is a divisional of U.S. patent application Ser. No. 14/048,766 that was filed Oct. 8, 2013, the entire contents of which are hereby incorporated by reference.

REFERENCE TO GOVERNMENT RIGHTS

This invention was made with government support under 0832760 awarded by the National Science Foundation. The government has certain rights in the invention.

BACKGROUND

Block copolymers (BCPs) are characterized by their ability to spontaneously self-assemble into dense periodic nanostructures having domains with small length scales. In the self-assembly process, factors which govern the size of the domains are the degree of polymerization (N) and the Flory-Huggins interaction parameter ($\chi$) which is a measure of thermodynamic interactions between the polymer blocks. If $\chi N$ is below a critical value, then the BCP will be disordered. Thus, for a given $\chi$, the degree of polymerization can only be decreased a certain amount until the BCP no longer self-assembles. However, the resulting domain size correlates quite closely with N, thereby rendering this approach less useful for generating small domain sizes for nanolithography.

$\chi_{BCP}$ can be approximated as the degree of immiscibility between the blocks of the BCP. The most straightforward way to increase pop, therefore, is to increase the difference in polarity between the blocks. For a rough approximation of polarity, solubility parameters can be useful as they have been tabulated for a broad range of homopolymers.

Poly(4-hydroxystyrene) [P(4-HS)] has a high solubility parameter (24.55 $(J/cm^3)^{1/2}$) indicating a high degree of polarity and hydrophilicity. Due to the acidic and reactive nature of the phenol group, 4-hydroxystyrene (HS) has been protected before polymerization using a variety of groups. 4-acetoxystyrene, for example, has been employed in living free radical polymerizations and is deprotected by alkaline hydrolysis. (See, Kanagasabapathy, S.; Sudalai, A.; Benicewicz, B. C., *Macromol. Rapid Commun.* 2001, 22, 1076-1080 and Barclay, G. G.; Hawker, C. J.; Ito, H.; Orellana, A.; Malenfant, P. R. L.; Sinta, R. F., *Macromolecules* 1998, 31, 1024-1031.) However, anionic polymerization requires more stringent protection, hence monomers such as 4-tert-butoxystyrene and 4-tert-butyldimethylsilyloxystyrene have been used and deprotected under reflux with strong acid or reaction with fluoride anion. (See, Se, K.; Miyawaki, K.; Hirahara, K.; Takano, A.; Fujimoto, T., *J. Polym. Sci., Part A: Polym. Chem* 1998, 36, 3021-3034 and Ito, H.; Knebelkamp, A.; Lundmark, S. B.; Nguyen, C. V.; Hinsberg, W. D., *J. Polym. Sci., Part A: Polym. Chem.* 2000, 38, 2415-2427.) Unfortunately, many polymer blocks that might be polymerized with PHS to provide useful BCPs are degraded by strong acids and attacked by fluoride anions.

SUMMARY

BCPs for use in block copolymer lithography, self-assembled films of the BCPs and methods for polymerizing the BCPs are provided.

One embodiment of a block copolymer comprises a first polymer block comprising polymerized hydroxystyrene and a second polymer block, the block copolymer having a Flory-Huggins interaction parameter of at least 0.15.

The block copolymer can be used in a method of transferring a pattern into a substrate via BCP lithography by: depositing the block copolymer over the substrate and subjecting the block copolymer to conditions that induce the block copolymer to self-assemble into a plurality of domains; selectively removing some of the domains, such that the self-assembled block copolymer layer defines a pattern over the substrate; and transferring the pattern into the substrate to provide a patterned substrate.

In another method of transferring a pattern into a substrate via BCP lithography, a block copolymer of poly(t-butyl styrene-b-2-vinylpyridine) (PtBuSt-b-P2VP) is used. This method comprises: depositing the PtBuSt-b-P2VP block copolymer over the substrate and subjecting the PtBuSt-b-P2VP block copolymer to conditions that induce it to self-assemble into a plurality of domains; selectively removing some of the domains, such that the self-assembled PtBuSt-b-P2VP block copolymer layer defines a pattern over the substrate; and transferring the pattern into the substrate to provide a patterned substrate.

One embodiment of a method of making a block copolymer having a polyhydroxystyrene block via living anionic polymerization comprises: polymerizing acetal group-protected hydroxystyrene monomers via anionic polymerization, whereby living anions comprising the polymerized protected hydroxystyrene monomers are formed; polymerizing a second monomer at the chains ends of the living anions via living anionic polymerization; and deprotecting the acetal group-protected hydroxystyrene groups, to form the block copolymer comprising a first polymer block comprising polymerized hydroxystyrene and a second polymer block comprising polymerized second monomer, wherein the block copolymer has a Flory-Huggins interaction parameter of at least 0.15.

Other principal features and advantages of the invention will become apparent to those skilled in the art upon review of the following drawings, the detailed description, and the appended claims.

BRIEF DESCRIPTION OF THE DRAWINGS

FIGS. 1A-K show the structures of BCPs comprising a PHS block and a second polymer block. The second polymer block is: FIG. 1A: polydimethysiloxane (PDMS); FIG. 1B: poly(tert-butyl styrene) (PtBS or PtBuSt); FIG. 1C: poly(3,5-di t-butyl substituted styrene); FIG. 1D: poly(4-trimethylsilylstyrene) (PSSi); FIG. 1E: poly(4-methyl styrene); FIG. 1F: poly(methacrylisobutyl polyhedral oligomeric silsesquioxane) (PMAPOSS); FIG. 1G: poly(isopropyl methacrylate); FIG. 1H: poly(4-t-butylcyclohexyl methacrylate); FIG. 1I: poly(4-t-butyl phenyl methacrylate); FIG. 1J: polyisoprene (polymerized with P(4-HS)); and FIG. 1K: polyisoprene (polymerized with P(3-HS)).

FIGS. 2A-E show the structures of acetal group-protected HS monomers that can be used to form the PHS blocks in a BCP via anionic polymerization. FIG. 2A: 4-(2-tetrahydropyranyloxy)styrene (OTHPSt); FIG. 2B: 4-(2-tetrahydrofuranyloxy)styrene (OTHFSt); FIG. 2C: 4-(1-ethoxy ethoxy)styrene (pEES); FIG. 2D: 4-(2-methoxymethoxy)styrene; and FIG. 2E: 4-((2-methoxyethoxy)methoxy)styrene.

DETAILED DESCRIPTION

BCPs for use in block copolymer lithography, self-assembled films of the BCPs and methods for polymerizing the BCPs are provided. The BCPs are characterized by high Flory-Huggins interaction parameters ($\chi$) and can be polymerized with low overall degrees of polymerization (N). Such BCP are able to self-assemble into domains having very small dimensions and, therefore, are useful in BCP lithography. The BCPs can be polymerized from HS monomers or from tBS and 2-VP monomers.

The BCPs are characterized by $\chi$ values of at least 0.15. This includes BCPs having a $\chi$ of at least 0.3 and further includes BCPs having a $\chi$ of at least 0.5 and at least 1. For the purposes of this disclosure, $\chi$ is determined using small angle x-ray scattering (SAXS) and fitting the temperature dependent correlation hole scattering. The method is described by Seeger et al. in *Macromolecules* 1990, 23, 890-893. In this method, the correlation hole scattering is taken at different temperatures above the Tg of the BCP and the data is fit to the equations of state governing a disordered BCP. Plotting the calculated $\chi$ values versus inverse absolute temperature allows the calculation of $\chi=\alpha/T+\beta$. For the purposes of this disclosure, the recited $\chi$ values refer to those values at the highest Tg for the polymer blocks of the BCP.

The BCPs that are polymerized from HS monomers comprise a first polymer block polymerized from HS monomers and a second polymer block. The hydroxystyrene can be 4-hydroxystyrene (p-hydroxystyrene) or the meta- or ortho-substituted isomers thereof. The HS monomer may be substituted or unsubstituted. However, substituents that would increase the polarity of the monomers are typically disfavored since they can have deleterious effects on solubility and can increase Tg.

The second polymer block is polymerized from monomers whose homopolymers have a lower solubility parameter that does polyhydroxystyrene. In terms of Hildebrand solubility parameters, this means lower than about 24 $(J/cm^3)^{1/2}$. This includes monomers having a Hildebrand solubility parameter of no greater than 20, no greater than 19, no greater than 18 and no greater than 16 $(J/cm^3)^{1/2}$. The difference between the Hildebrand solubility parameters of the two polymer blocks can be, for example, at least 4 $(J/cm^3)^{1/2}$, at least 6 $(J/cm^3)^{1/2}$ or at least 8 $(J/cm^3)^{1/2}$.

Figure 1A:
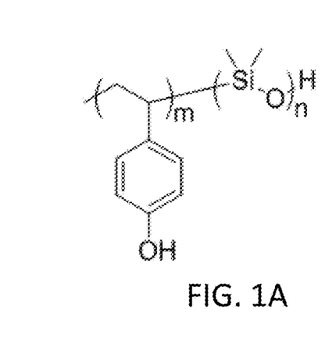
Figure 1B:
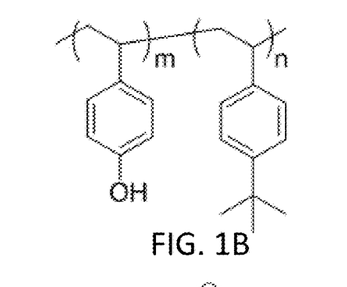
Figure 1C:
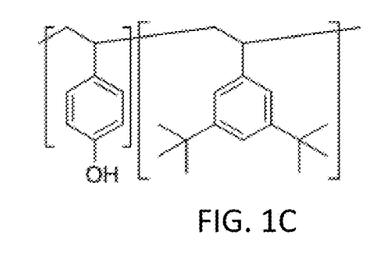
Figure 1D:
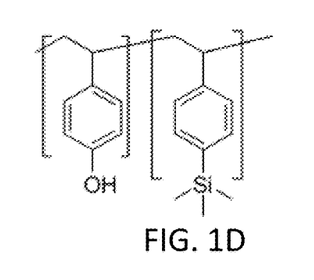
Figures 1E, 1F, 1G, 1H, 1I, 1J:
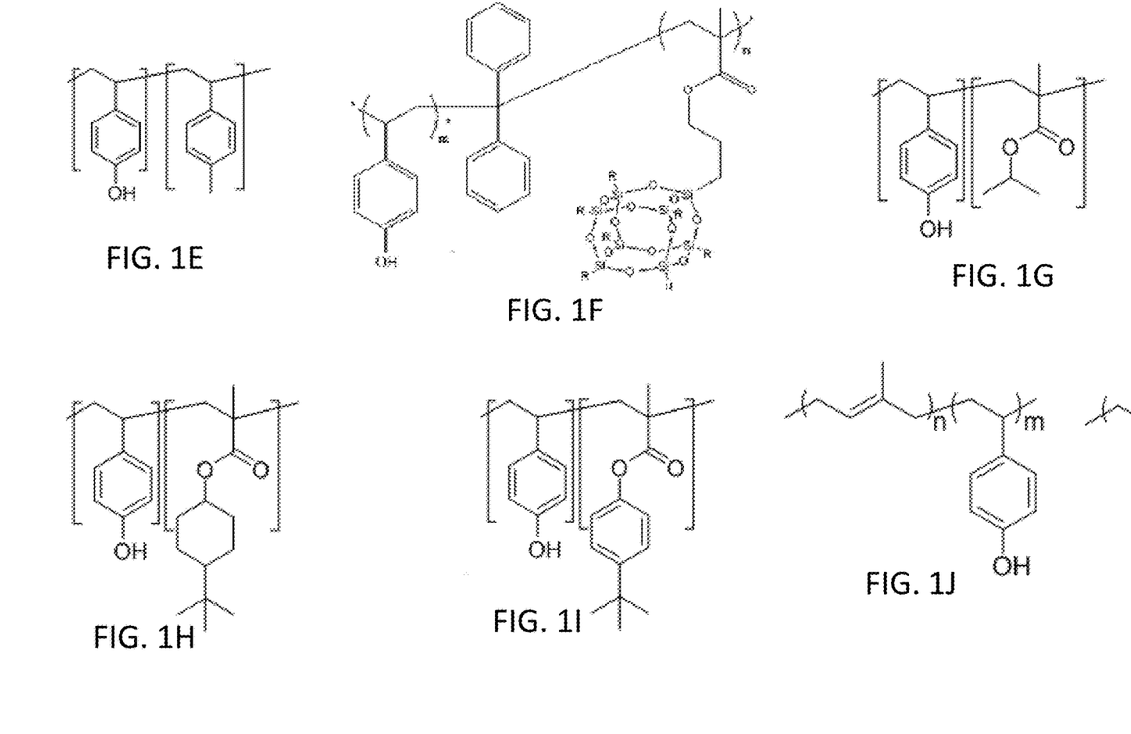

Examples of monomers that can be polymerized to provide the second block include polydimethylsiloxane (PDMS). The structure of a BCP comprising a first polymer block of PHS and a second polymer block of PDMS (PHS-b-PDMS) is shown in FIG. 1A. Other examples include substituted styrene monomers, such as tBuSt; 3,5-di t-butyl substituted styrene; (4-trimethylsilylstyrene) (SSi); and 4-methyl styrene. The structures of a BCP comprising a first block of PHS and a second block of each of these monomers are shown in FIGS. 1B, 1C, 1D and 1E, respectively. Still other examples include methacrylate monomers, such as methacrylisobutyl polyhedral oligomeric silsesquioxane (MAPOSS); isopropyl methacrylate; 4-t-butylcyclohexyl methacrylate and 4-t-butyl phenyl methacrylate. The structures of a BCP comprising a first block of PHS and a second block of each of these monomers are shown in FIGS. 1F, 1G, 1H and 1I, respectively. Alternatively, the second block of the BCP can be polymerized from diene monomers, such as isoprene or butadiene. The structures of a BCP comprising a first block of PHS and a second block of trans-1,4-polyisoprene are shown in FIGS. 1J and 1K, respectively. The second block could also be polymerized from 3,4-polyisoprene. However, in some embodiments, the second polymer block is not a diene polymer because, as elastomers, they can be difficult to process.

In the BCPs the mass ratio of PHS to the second polymer block will depend on the degree of polymerization and the desired domain size and morphology. By way of illustration only, in some embodiments of the BCPs the mass ratio of PHS to second polymer block is in the range from about 20:1 to about 1:1.

The overall degree of polymerization, N, of the BCPs can be controlled experimentally. N is desirably high enough that the product $\chi$N equals or exceeds the critical value for phase segregation for a desired phase (e.g., lamellae, cylinders, spheres, gyroids, etc.) However, N is also desirably minimized in order to provide phase domains with small dimensions.

The PHS-based BCPs can be made using sequential living anionic polymerization reactions by selecting appropriate protecting groups for the hydroxy group of the HS monomer. More specifically, acetal protecting groups that can be removed under relatively mild conditions are used in order to avoid the degradation of the second polymer block during the deprotection process. The acetal protecting groups are formed by reacting the hydroxy group with a moiety that reacts with said hydroxy group and converts it into an acetal group. The resulting hydroxystyrene derivative is referred to as an acetal group-protected hydroxystyrene. Some of the acetal protecting groups can be deprotected under mildly acidic conditions, such as those provided by a dilute solution of hydrochloric acid at low temperatures. For example, in some embodiments of the methods, complete deprotection can be carried out in a dilute HCl solution (e.g., having a concentration of ≤20 ppm) at a temperature of 23° C., or lower, over a period of 5 hours or less.

The use of living anionic polymerization to form PHS block-containing BCPs is illustrated in Examples 1 and 2 below. The basic steps of the process are as follows: acetal group-protected HS monomers are polymerized using anionic polymerization to create living anions comprising the polymerized, protected HS. These living anions are then chain extended via living anionic polymerization by exposing them to a second monomer to form a block copolymer comprising a first block of polymerized, protected HS and a second block polymerized from the second monomers. The acetal groups of the protected HS are then converted back into hydroxy groups to provide the final deprotected BCP.

Figure 2A:
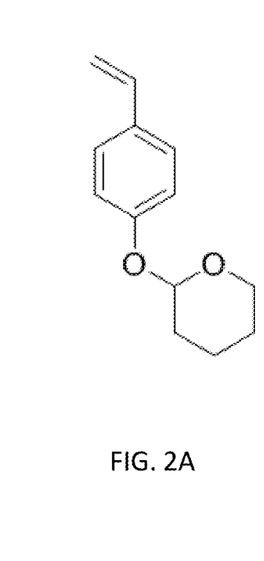
Figure 2B:
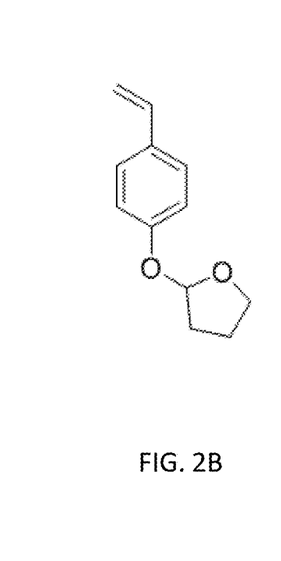
Figure 2C:
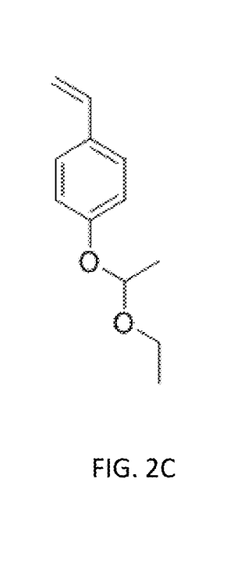
Figure 2D:
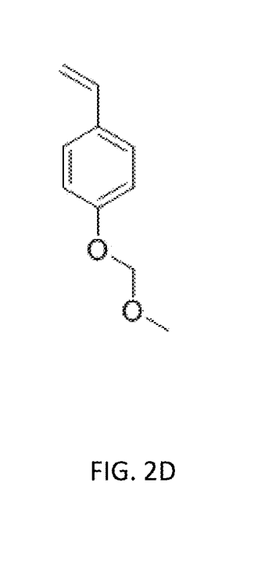
Figure 2E:
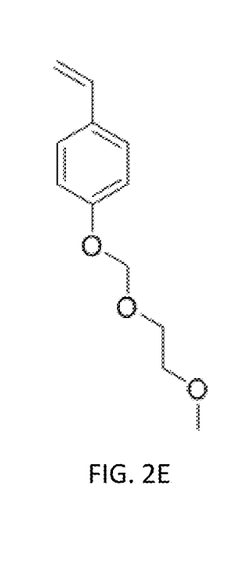

The acetal protecting groups can be alkyl acetals characterized by the formula:

where $R^1$ is independently hydrogen or a substituted or unsubstituted hydrocarbon group and $R^2$ is a substituted or unsubstituted hydrocarbon group. Examples of hydrocarbon groups are the lower alkyl groups, that is—alkyl groups having 1-6 carbons in the alkyl chain. Substituted hydrocarbon groups include alkoxy groups, such as lower alkoxy groups. Thus, in some embodiments, the acetal protecting groups are alkoxyalkoxy groups, which include alkoxyalkoxyalkoxy groups. In some embodiments, $R^1$ and $R^2$ are joined together by a hydrocarbon chain to provide a ring structure. Such embodiments include those in which the acetal group is a tetrahydropyranyl group or a tetrahydrofuranyl group. FIGS. 2A and 2B, respectively show acetal protected hydroxystyrene monomers that are protected by a 2-tetrahydropyranyl group (i.e., 4-(2-tetrahydropyranyl)oxystyrene) and by a 2-tetrahydrofuranyl group (i.e., 4-(2-tetrahydrofuranyl)oxystyrene). FIGS. 2C and 2D show examples of acetal protected hydroxystyrene monomers in which $R^2$ is an alkyl group and FIG. 2E shows and example of an acetal protected hydroxystyrene monomer in which $R^2$ is an alkoxy group.

Other embodiments of the BCPs are polymerized from tBuSt monomers and 2VP monomers (P(tBuSt-b-2VP)). Like the BCPs polymerized from HS monomers, the P(tBuSt-b-2VP) BCPs can be polymerized via living anionic polymerization, as illustrated in Example 3. The P(tBuSt-b-2VP) BCPs are characterized by high values of $\chi$ at least 0.25 and have moderate Tg values, which facilitate processing by thermal annealing.

Once the BCP has been formed, a layer of the BCP can be deposited on a substrate using a coating technique such as spin-coating. The BCP can then be subjected to conditions that induce the formation of a pattern of domains in the block copolymer film due to phase segregation. The step of subjecting the BCP to conditions that induce it to undergo domain formation include subjecting the BCP to a thermal anneal for a time sufficient to allow the block copolymer to self-assemble into domains or subjecting the block copolymer to a solvent anneal. During a solvent anneal, the BCP film undergoes swelling as it is exposed to a saturated solvent vapor atmosphere, typically at room temperature (23° C.), for a time sufficient to allow the BCP to self-assemble into domains.

After the self-assembled BCP layer has been formed, it can be converted into an etch mask by selectively removing (e.g., etching) one or more of the domains from the block copolymer layer to provide a mask pattern. For block copolymers having an insufficient etch contrast between the polymers of the polymer blocks, the step of selectively removing domains can include incorporating metal ions into a domain to form a hard template. Such processes can be carried out using metal seeding, as described in *Nature Nanotechnology* 2007, 2, 500-506 or atomic layer deposition (ALD), as described in *Adv. Mater.* 2010, 22, 5129-5133. Such methods may be advantageous when the second block does not contain silicon, as is the case with the PtBuSt-b-P2VP BCPs.

The mask pattern can then be transferred to an underlying substrate. This pattern transfer can be carried out by additive or subtractive processes and, once the pattern transfer is complete, the remaining portions of the BCP layer can be removed. For example, the pattern can be transferred to an underlying substrate by selectively chemically modifying regions of the substrate surface that are exposed through the mask by chemical functionalization; by selectively removing (e.g., etching) regions of the substrate that are exposed through the mask; or by selectively coating (e.g., by material growth or deposition) regions of the substrate that are exposed through the mask.

In some embodiments, the BCP self-assembles into either a plurality of cylindrical domains in which the cylinders are oriented perpendicular or parallel with respect to the underlying substrate surface, or into a plurality of lamellar domains in which the lamellar planes are oriented perpendicular with respect to the substrate surface, such that the self-assembled block copolymer layer defines either a hole pattern or a striped pattern over the substrate.

Because the domains in the BCP can be formed with nanoscale dimensions (e.g., with dimensions, such as cylinder diameters, sphere diameters or lamellae thicknesses, of ≤100 nm, ≤20 nm or ≤10 nm) the features of the pattern transferred into the underlying substrate can have correspondingly small dimensions (e.g., hole diameters or stripe widths).

EXAMPLES

Example 1: Synthesis of BCPs Comprising PHS Blocks Via Living Anionic Polymerization Using OTHPSt Protecting Groups Experimental Materials All reagents were purchased from Aldrich Chemical Co. and used as received unless otherwise stated. Polymerizations were performed using either inert atmosphere (Ar) techniques or high-vacuum break seal glassware (Hadjichristidis et al. *J. Polym. Sci. A Polym. Chem.* 2000, 38, 3211-3234). Tetrahydrofuran (THF) was dried over Na/benzophenone ketyl and freshly distilled before use. Benzene was stirred over $H_2SO_4$ for 1 week then separated and distilled from $CaH_2$, then Na. 4-(2-tetrahydropyranyloxy)styrene (OTHPSt) was prepared according to a modified literature procedure (Hesp et al. *J. Appl. Polym. Sci.* 1991, 42, 877-883). 3-(2-tetrahydropyranyloxy)styrene (3-OTHPSt) was prepared in an analogous manner using 3-hydroxybenzaldehyde. 4-tert-butylstyrene (tBuSt) was distilled first from $CaH_2$ under vacuum and then di-n-butylmagnesium and stored in ampoules under vacuum at −20° C. 1,1-diphenylethylene (DPE) was distilled over n-butyllithium. 3-(3,5,7,9,11,13,15-Heptaisobutylpentacyclo-[9.5.1.$3^{,9}1^{5,15}1^{7,13}$]octasiloxan-1-yl)propyl methacrylate (MAPOSS) was purchased from Hybrid Plastics and recrystallized from methanol (MeOH) and dried in a vacuum oven at 60° C. for 24 h then dissolved in THF. Isoprene was distilled from $CaH_2$ and then n-BuLi under vacuum and stored in ampoules under vacuum at −20° C. Hexamethyltricyclosiloxane ($D_3$) was stirred over $CaH_2$ at 50° C. overnight then distilled under vacuum. $D_3$ was then added to a solution of poly(styryl)lithium in benzene and stirred for 2 hours. The $D_3$ and benzene solution were distilled together into ampoules under vacuum and stored at −20° C. Lithium chloride (LiCl) was heated at 110° C. for 48 hours and stored in a dessicator. Methanol was deoxygenated either under vacuum or by sparging with Ar.

4-(2-tetrahydropyranyloxy)benzaldehyde

To a suspension of 4-hydroxybenzaldehyde (61.1 g, 0.5 mol) in 750 mL dichloromethane (DCM) was added 3,4-2H-dihydropyran (58.9 g, 0.7 mol) and pyridinium p-toluenesulfonate (TsOH) (0.67 g, 2.7 mmol). The reaction was stirred under nitrogen at room temperature and monitored by thin layer chromatography ($CHCl_3$ eluent) until complete conversion, approximately 1 hour. The reaction was quenched with a saturated solution of sodium carbonate and allowed to stir for 10 min. The layers were separated and the organic layer washed with aq. sodium carbonate twice and water once. The organic layer was dried over sodium sulfate and solvent removed by rotary evaporation. The resulting crude oil was used without further purification. Typical yield, 98 g, 95%. $^1$H NMR (400 MHz, CDCl$_3$) δ 9.89 (s, 1H), 7.87-7.78 (m, 2H), 7.20-7.12 (m, 2H), 5.54 (t, J=3.1 Hz, 1H), 3.85 (ddd, J=11.3, 9.9, 3.1 Hz, 1H), 3.63 (dtd, J=11.4, 4.0, 1.4 Hz, 1H), 2.10-1.92 (m, 1H), 1.89 (ddd, J=7.6, 4.9, 3.2 Hz, 2H), 1.81-1.53 (m, 3H).

4-(2-tetrahydropyranyloxy)styrene (OTHPSt)

4-(2-tetrahydropyranyloxy)benzaldehyde (93 g, 0.45 mol) was dissolved in 1200 mL of THF and methyltriphenylphosphonium bromide (MePPh$_3$Br) (250 g, 0.7 mol) was added with vigorous stirring under nitrogen. The flask was cooled via an external ice bath and a solution of potassium tert-butoxide (KOtBu) (100 g, 0.89 mol) in 300 mL THF was added dropwise. After the addition was complete, the reaction was stirred overnight at room temperature. The reaction was then filtered over celite to remove various salts and the filtrate was concentrated to approximately 500 mL. This suspension was then poured into 1500 mL hexanes with vigorous stirring and the suspension filtered over celite. Concentration, precipitation and filtration steps were repeated once more. Solvent was removed by rotary evaporation and the residue was distilled under high vacuum (b.p. ~120° C.) to yield a colorless oil (60 g, 65% yield). For anionic polymerization, OTHPSt was distilled further from CaH$_2$ and then NaH under high vacuum. The viscous oil was diluted with THF (70% OTHPSt v/v) to allow for easier injection into the reactor. $^1$H NMR (300 MHz, CDCl$_3$) δ 7.37-7.31 (m, 2H), 7.04-6.96 (m, 2H), 6.65 (dd, J=17.6, 10.8 Hz, 1H), 5.60 (dd, J=17.6, 1.0 Hz, 1H), 5.41 (t, J=3.3 Hz, 1H), 5.12 (dd, J=10.9, 1.0 Hz, 1H), 3.89 (ddd, J=11.3, 9.3, 3.2 Hz, 1H), 3.59 (dtd, J=11.4, 4.1, 1.6 Hz, 1H), 2.22-1.46 (m, 6H). $^{13}$C NMR (75 MHz, CDCl$_3$) δ 157.07, 136.53, 131.50, 127.51, 116.70, 112.04, 96.54, 62.22, 30.57, 25.45, 19.00.

The scheme for the synthesis of OTHPSt is shown in Scheme 1.

Scheme 1.

Anionic Polymerization of OTHPSt

An oven-dried flask equipped with a PTFE stopcock was cooled under argon and 40 mL of THF was added. The flask was cooled to −78° C. and sec-butyllithium (sec-BuLi) (1.4 M in cyclohexane) (caution: sec-butyllithium is a highly reactive, pyrophoric reagent, handle with care) was added dropwise until a yellow color persisted. The flask was slowly warmed to room temperature until the solution became colorless and then chilled to −78° C. A measured amount of sec-butyllithium was added for the desired molecular weight and the desired volume of OTHPSt/THF solution (70% v/v) was injected into the flask with stirring, yielding an orange/red color from the living anion. After 30 minutes, methanol was added to quench the chain end and the THF solution was slowly poured into 400 mL of methanol to precipitate the P(OTHPSt) homopolymer. The polymer was recovered by vacuum filtration as a white powder. The resulting powder was dried under vacuum at room temperature.

Chain Extension with tBuSt

Following the previous procedure to generate the P(OTHPSt) living anion, an aliquot of 0.1 mL was removed from the flask by syringe and quickly precipitated into methanol for analysis by gel-permeation chromatography. The desired volume of tBuSt was then rapidly injected into the flask and stirred for 30 minutes before methanol was used to terminate the polymerization. The THF solution was slowly poured into methanol to precipitate the P(OTHPSt-b-tBuSt) block copolymer and the resulting white powder was recovered by vacuum filtration. The powder was dried under vacuum at room temperature. Typical molecular weights ranged from 3.9 kDa to 50 kDa with PDI's between 1.02 and 1.05.

Eight diblock P(OTHPSt-b-tBuSt) copolymers with varying degrees of polymerization within the corresponding polymer blocks were synthesized with OTHPSt:tBuSt molar ratios ranging from 2:095 to 1:2. In addition, two triblock (ABA or BAB) P(OTHPSt-b-tBuSt) copolymers having varying degrees of polymerization within the PtBuSt blocks or the POTHPSt blocks were synthesized. The number average molecular weights for the POTHPSt block and the BCP and the polydispersity indices for the BCPs, as well as the molar ratios for the polymer blocks, are shown in Tables 1 and 2.

TABLE 1

| Sample | Mn (OTHPSt) | Mn (BCP) | PDI (BCP) | OTHPSt:tBuSt |
|---|---|---|---|---|
| 1 | 4200 | 7600 | 1.03 | 1:0.8 |
| 2 | 9800 | 20100 | 1.02 | 1:1 |
| 3 | 6200 | 13800 | 1.02 | 1:1.05 |
| 4 | 3400 | 12000 | 1.03 | 1:2 |
| 5 | 5600 | 16400 | 1.02 | 1:1.7 |
| 6 | 8300 | 29800 | 1.03 | 1:1.8 |
| 7 | 1700 | 3900 | 1.04 | 1:1.7 |
| 8 | 7000 | 23200 | 1.02 | 1:1.9 |
| 9 | 2300 | 3800 | 1.05 | 1:0.85 |
| 10 | 42100 | 54700 | 1.03 | 2:0.95 |
| 11 | 3000 | 5300 | 1.05 | 1:0.8 |

TABLE 2

| Sample (ABA) | Mn (1st Block) | Mn (Diblock) | Mn (Triblock) | PDI | Block A:Block B:Block A |
|---|---|---|---|---|---|
| P(tBuSt:OTHPSt:tBuSt) | 4300 | 10400 | 12600 | 1.03 | 1:1.33:0.95 |
| P(OTHPSt:tBuSt:OTHPSt) | 3700 | 7900 | 12700 | 1.03 | 1:0.9:0.85 |

Chain Extension with MAPOSS

Following the previous procedure to generate the P(OTHPSt) living anion with the addition of LiCl at the beginning of the polymerization, 5 molar equivalents of DPE was added to the flask which generated a dark red color. The reaction was stirred for 10 minutes and then a 0.1 mL aliquot was taken by syringe and quickly precipitated into methanol. A solution of MAPOSS in THF was then added rapidly to the polymerization and the solution immediately became colorless. The polymerization was stirred for 30 minutes and then quenched by the addition of degassed methanol. The viscous solution was then poured slowly into methanol to precipitate the P(OTHPSt-b-MAPOSS) block copolymer and the resulting white powder was recovered by vacuum filtration. Typical molecular weights ranged from 5.3 kDa to 70 kDa with PDI's between 1.03 and 1.04.

The scheme for the synthesis of P(OTHPSt-b-MAPOSS) is shown in Scheme 2.

Scheme 2.

Five diblock P(OTHPSt-b-MAPOSS) polymers having varying degrees of polymerization within the corresponding polymer blocks were synthesized with OTHPSt:MAPOSS molar ratios ranging from 4:1 to 12:1. The number average molecular weights and polydispersity indices for the POTHPSt block and the BCP, as well as the molar ratios for the polymer blocks, are shown in Table 3.

TABLE 3

| Sample | $M_n$ OTHPSt | PDI OTHPSt | $M_n$ BCP | PDI BCP | $M_n$ (NMR) | OTHPSt:MAPOSS |
|---|---|---|---|---|---|---|
| 1 | 12900 | 1.03 | 16300 | 1.04 | 27900 | 4:1 |
| 2 | 62000 | 1.04 | 70000 | 1.03 | 85000 | 12:1 |
| 3 | 3300 | 1.04 | 5300 | 1.04 | 5900 | 6:1 |
| 4 | 17200 | 1.03 | 21200 | 1.03 | 25700 | 10:1 |
| 5 | 39000 | 1.03 | 44000 | 1.03 | 57900 | 10:1 |

Chain Extension with D₃

Following the previous procedure to generate the P(OTH-PSt) living anion, an aliquot of 0.1 mL was removed from the flask by syringe and quickly precipitated into methanol. A solution of D₃ in benzene was then added to the polymerization and the orange/red color of the OTHPSt anion slowly faded. The reaction was warmed to 25° C. and stirred for two hours to reach approximately 50% conversion. The polymerization was terminated with a solution of chlorotrimethylsilane and pyridine (1:2) in THF. The resulting solution was poured slowly into methanol to precipitate the P(OTHPSt-b-DMS) block copolymer and the resulting white powder was recovered by vacuum filtration. Typical molecular weights ranged from 9.5 kDa to 25 kDa with PDI's of 1.05.

Polymerization of Poly(Isoprene) with Majority 1,4 Microarchitecture and Chain Extension with 3-OTHPSt Isoprene was polymerized by adding sec-butyllithium to a solution of isoprene in benzene at room temperature. The polymerization was stirred overnight and a small aliquot taken before being frozen in liquid nitrogen. THF was then distilled into the flask (~2:1 THF:benzene) and the flask warmed to −78° C. Upon complete thawing of the solvent, 3-OTHPSt was added to the reaction and the color quickly changed from yellow to orange. The polymerization was continued for 30 minutes and then quenched by the addition of methanol. The resulting solution was then poured slowly into methanol to precipitate the P(I-b-3-OTHPSt) block copolymer and the resulting rubbery solid was collected by filtration. Typical molecular weights ranged from 10 kDa to 20 kDa with PDI's around 1.06 to 1.08. Typically 93% 1,4 addition and 7% 3,4 from ¹H-NMR.

Deprotection of P(OTHPSt-b-tBuSt)

1.0 g of block copolymer was dissolved in 50 mL THF and then the solution was diluted with 50 mL of ethanol. If the solution became cloudy, THF was added until a clear solution was obtained once more. At this point, 0.1 mL of aq. HCl was added and the solution stirred overnight. After ¹H-NMR spectroscopy confirmed complete reaction, the solution was poured into water and the powder collected by filtration.

Deprotection of P(OTHPSt-b-MAPOSS)

1.0 g of block copolymer was dissolved in 50 mL THF and then the solution was diluted with 50 mL of ethanol, adding THF as necessary to maintain a clear solution. 5 mL aq. HCl was diluted to 50 mL using deionized water. Approximately 0.06 mL was added to the polymer solution and stirred until ¹H-NMR spectroscopy confirmed complete deprotection. Extended reaction time or higher acid concentration led to MAPOSS degradation. After deprotection was complete, the solution was poured into water and the powder collected by filtration.

Deprotection of P(OTHPSt-b-DMS)

1.0 g of block copolymer was dissolved in 50 mL THF and then the solution was diluted with 50 mL of ethanol (EtOH), adding THF as necessary to maintain a clear solution. 5 mL aq. HCl was diluted to 50 mL using deionized water. Approximately 0.06 mL was added to the polymer solution and stirred until ¹H-NMR spectroscopy confirmed complete deprotection. Extended reaction time or higher acid concentration led to PDMS degradation. After deprotection was complete, the solution was poured into water and the powder collected by filtration.

The scheme for the synthesis and subsequent deprotection of P(OTHPSt-b-DMS) is shown in Scheme 3.

Scheme 3.

Deprotection of P(I-b-3-OTHPSt)

1.0 g of block copolymer was dissolved in 50 mL THF and then the solution was diluted with 50 mL of ethanol. If the solution became cloudy, THF was added until a clear solution was obtained once more. At this point, 0.1 mL of aq. HCl was added and the solution stirred overnight. After $^1$H-NMR spectroscopy confirmed complete reaction, the solution was poured into water and the powder collected by filtration.

Characterization $^1$H NMR, $^{13}$C NMR and $^{29}$Si spectra were recorded in CDCl$_3$, THF-d$_8$ or acetone-d$_6$ using a Bruker Avance-400, a Varian MecuryPlus 300 or Bruker Avance-500 spectrometer with the residual solvent peak as internal reference. Gel-permeation chromatography (GPC) was performed using a Viscotek 2210 system equipped with three Waters columns (HR 4, HR 4E, HR 3) and a 1 mL/min flow rate of THF as eluent at 30° C. Monodisperse PS standards were used for calibration. Thermal gravimetric analysis was performed on a TA Instruments Q500 using a heating rate of 10° C. per minute under a nitrogen atmosphere. Differential scanning calorimetry was performed on a TA Instruments Q100 using a heating and cooling rate of 10° C. per minute for three cycles. Glass transition temperatures were determined from the third cycle. Samples for small angle x-ray scattering (SAXS) were solvent cast by the slow evaporation of THF solutions and then further annealed at various temperatures for 12 hours under vacuum. SAXS was performed both at the 12-ID-B beamline at the Advanced Photon Source at Argonne National Laboratory using a beam energy of 12 keV (1.025 Å) and using a Rigaku instrument operating at 45 kV with Cu k-alpha radiation (1.54 Å). Temperature-dependent SAXS was performed using a Linkam DSC stage with a 5 minute pre-equilibration delay before data collection at a given temperature.

Results

Table 4 lists the morphology of the post-anneal self-assembled PHS-b-tBuSt BCP films of Table 1, including the domain dimensions. (For the lamellae-forming BCP films, the recited dimension corresponds to the height of the lamellae (pitch). For the cylinder-forming BCP films, the recited dimension corresponds to the periodicity of the hexagonal array.)

TABLE 4

| Sample | Morphology | L$_0$ (nm) |
| --- | --- | --- |
| 1 | Lamellar | 10.5 |
| 2 | Lamellar | 20.7 |
| 3 | Lamellar | 15.7 |
| 4 | PHS cylinders | 15.8 |
| 5 | PHS cylinders | 19.1 |
| 6 | PHS cylinders | 25.4 |
| 7 | Disordered | |
| 8 | PHS cylinders | 19.5 |
| 9 | Disordered | |
| 10 | Lamellar | 25.1 |
| 11 | Lamellar | 8.8 |

Example 2: Synthesis of BCPs Comprising PHS Blocks Via Living Anionic Polymerization Using Other Acetal Protecting Groups

4-(2-tetrahydrofuranyloxy)benzaldehyde

To a suspension of 4-hydroxybenzaldehyde in dichloromethane (DCM) is added 2-chlorotetrahydrofuran and triethylamine (Et$_3$N). The reaction is stirred under nitrogen at room temperature and monitored by thin layer chromatography (CHCl$_3$ eluent) until complete conversion. Water is added and the layers are separated and the organic layer washed with water twice. The organic layer is dried over sodium sulfate and solvent removed by rotary evaporation. The resulting crude oil is used without further purification.

4-(2-tetrahydrofuranyloxy)styrene (OTHFSt)

4-(2-tetrahydrofuranyloxy)benzaldehyde is dissolved in THF and methyltriphenylphosphonium bromide (MePPh$_3$Br) is added with vigorous stirring under nitrogen. The flask is cooled via an external ice bath and a solution of potassium tert-butoxide (KOtBu) in THF is added dropwise. After the addition is complete, the reaction is stirred overnight at room temperature. The reaction is then filtered over celite to remove various salts and the filtrate is concentrated. This suspension is then poured into hexanes with vigorous stirring and the suspension filtered over celite. Concentration, precipitation and filtration steps are repeated once more. Solvent is removed by rotary evaporation and the residue is distilled under high vacuum (b.p. ~120° C.) to yield a colorless oil. For anionic polymerization, OTHFSt is distilled further from CaH$_2$ and then NaH under high vacuum. The viscous oil is diluted with THF to allow for easier injection into the reactor.

The scheme for the synthesis of OTHFSt is shown in Scheme 4.

Scheme 4.

4-(1-ethoxy ethoxy)styrene (pEES)

pEES can be synthesized according to the procedures described by Endo et al. in *J. Polym. Sci., Part A: Polym. Chem.* 2011, 49 (21) 4714-4720 and by Frey et al. in *ACS Macro. Lett.* 2013, 2, 409-413.

4-(2-methoxymethoxy)benzaldehyde

To a suspension of 4-hydroxybenzaldehyde in dichloromethane (DCM) is added methoxymethyl chloride and N,N-diisopropylethylamine (i-Pr$_2$NEt). The reaction is stirred under nitrogen at room temperature and monitored by thin layer chromatography (CHCl$_3$ eluent) until complete conversion. Water is added and the layers are separated and the organic layer washed with water twice. The organic layer is dried over sodium sulfate and solvent removed by rotary evaporation. The resulting crude oil is used without further purification.

4-(2-methoxymethoxy)styrene 4-(2-methoxymethoxy)benzaldehyde is dissolved in THF and methyltriphenylphosphonium bromide (MePPh$_3$Br) is added with vigorous stirring under nitrogen. The flask is cooled via an external ice bath and a solution of potassium tert-butoxide (KOtBu) in THF is added dropwise. After the addition is complete, the reaction is stirred overnight at room temperature. The reaction is then filtered over celite to remove various salts and the filtrate is concentrated. This suspension is then poured into hexanes with vigorous stirring and the suspension filtered over celite. Concentration, precipitation and filtration steps are repeated once more. Solvent is removed by rotary evaporation and the residue is distilled under high vacuum (b.p. ~120° C.) to yield a colorless oil.

The scheme for the synthesis of 4-(2-methoxymethoxy)styrene is shown in Scheme 5.

Scheme 5.

4-((2-methoxyethoxy)methoxy)benzaldehyde

To a suspension of 4-hydroxybenzaldehyde in dichloromethane (DCM) is added 2-methoxyethoxymethyl chloride and N,N-diisopropylethylamine (i-Pr$_2$NEt). The reaction is stirred under nitrogen at room temperature and monitored by thin layer chromatography (CHCl$_3$ eluent) until complete conversion. Water is added and the layers are separated and the organic layer washed with water twice. The organic layer is dried over sodium sulfate and solvent removed by rotary evaporation. The resulting crude oil is used without further purification.

4-((2-methoxyethoxy)methoxy)styrene 4-((2-methoxyethoxy)methoxy)benzaldehyde is dissolved in THF and methyltriphenylphosphonium bromide (MePPh$_3$Br) is added with vigorous stirring under nitrogen. The flask is cooled via an external ice bath and a solution of potassium tert-butoxide (KOtBu) in THF is added dropwise. After the addition is complete, the reaction is stirred overnight at room temperature. The reaction is then filtered over celite to remove various salts and the filtrate is concentrated. This suspension is then poured into hexanes with vigorous stirring and the suspension filtered over celite. Concentration, precipitation and filtration steps are repeated once more. Solvent is removed by rotary evaporation and the residue is distilled under high vacuum (b.p. ~120° C.) to yield a colorless oil.

The scheme for the synthesis of 4-((2-methoxyethoxy)methoxy)styrene is shown in Scheme 6.

Scheme 6.

Anionic Polymerization of Acetal Group-Protected Styrene Monomers (AGP-St)

An oven-dried flask equipped with a PTFE stopcock is cooled under argon and THF is added. The flask is cooled and sec-butyllithium (sec-BuLi) (caution: sec-butyllithium is a highly reactive, pyrophoric reagent, handle with care) is added dropwise until a yellow color persists. The flask is slowly warmed to room temperature until the solution became colorless and then chilled. A measured amount of sec-butyllithium is added for the desired molecular weight and the desired volume of AGP-St/THF solution is injected into the flask with stirring, to form the living anion. After 30 minutes, methanol is added to quench the chain end and the THF solution is slowly poured into methanol to precipitate the P(AGP-St) homopolymer. The polymer is recovered by vacuum filtration as a powder. The resulting powder is dried under vacuum at room temperature.

Chain Extension of P(AGP-St) with Comonomers

BCPs of the P(AGP-St)s with a second monomer (e.g., tBuSt, MAPOSS, DMS) are polymerized using the procedures described in Example 1, whereby a solution of the second monomer is added rapidly to a solution of the living anionic P(AGP-St) for a time and at a temperature sufficient to allow for chain extension via anionic polymerization of the second monomers at the P(AGP-St) chain ends. The reaction is then quenched. The BCPs are then precipitated and recovered.

Deprotection of P(AGP-St-b-Comonomer)

BCPs of the P(AGP-St) and the second monomer (e.g., tBuSt, MAPOSS, DMS) are deprotected using the procedures described in Example 1. 1.0 g of the block copolymer is dissolved in 50 mL THF and then the solution is diluted with 50 mL of ethanol, adding THF as necessary to maintain a clear solution. 5 mL aq. HCl is diluted to 50 mL using deionized water. Approximately 0.06 mL is added to the polymer solution and stirred until $^1$H-NMR spectroscopy confirms complete deprotection. After deprotection is complete, the solution is poured into water and the powder collected by filtration.

Example 3: Synthesis of P(tBuSt-b-2VP)

Experimental

Materials

All reagents were purchased from Aldrich Chemical Co. and used as received unless otherwise stated. Polymerizations were performed using either inert atmosphere (Ar) techniques. Tetrahydrofuran (THF) was dried over Na/benzophenone ketyl and freshly distilled before use. 4-tert-butylstyrene (tBuSt) was distilled first from $CaH_2$ under vacuum and then di-n-butylmagnesium and stored under argon at −20° C. 1,1-diphenylethylene (DPE) was distilled over n-butyllithium. Lithium chloride (LiCl) was heated at 110° C. for 48 hours and stored in a dessicator. Methanol was deoxygenated either under vacuum or by sparging with Ar. 2-vinylpyridine (2VP) was distilled first from $CaH_2$ under vacuum and then triethylaluminum and then stored at −20° C.

Polymerization of P(tBuSt-b-2VP)

An oven-dried flask equipped with a PTFE stopcock and 30 mg LiCl was cooled under argon and 40 mL of THF was added. The flask was cooled to −78° C. and sec-butyllithium (1.4 M in cyclohexane) was added dropwise until a yellow color persisted. The flask was slowly warmed to room temperature until the solution became colorless and then chilled to −78° C. A measured amount of sec-butyllithium was added for the desired molecular weight and the desired volume of tBuSt was injected into the flask with stirring, yielding an orange/red color from the living anion. After 30 minutes, 0.1 mL DPE was added which immediately generated a dark red color in the flask. A 0.1 mL aliquot was taken using a syringe and quickly added to methanol to quench the anion. After 10 minutes, 2VP was added to the flask (no discernible color change was observed). After 30 minutes, methanol was added to quench the chain end and the THF solution was removed by evaporation. The resulting solid was dissolved in ~70 mL of acetone and slowly poured into 400 mL of water to precipitate the P(tBuSt-b-2VP) block copolymer. The polymer was recovered by vacuum filtration as a white powder. The resulting powder was dried under vacuum at room temperature. Typical molecular weights ranged from 7.7 kDa to 41 kDa with PDI's around 1.03 to 1.08.

Characterization $^1$H NMR spectra were recorded in $CDCl_3$, using a Bruker Avance-400 spectrometer with the residual solvent peak as internal reference. Gel-permeation chromatography (GPC) was performed using a Viscotek 2210 system equipped with three Waters columns (HR 4, HR 4E, HR 3) and a 1 mL/min flow rate of THF as eluent at 30° C. Monodisperse PS standards were used for calibration. Thermal gravimetric analysis was performed on a TA Instruments Q500 using a heating rate of 10° C. per minute under a nitrogen atmosphere. Differential scanning calorimetry was performed on a TA Instruments Q100 using a heating and cooling rate of 10° C. per minute for three cycles. Glass transition temperatures were determined from the third cycle. Samples for small angle x-ray scattering (SAXS) were solvent cast by the slow evaporation of THF solutions and then further annealed at various temperatures for 12 hours under vacuum. SAXS was performed using a Rigaku instrument operating at 45 kV with Cu k-alpha radiation (1.54 Å). Temperature-dependent SAXS was performed using a Linkam DSC stage with a 5 minute pre-equilibration delay before data collection at a given temperature.

Results

Nine diblock P(tBuSt-b-2VP) polymers were synthesized with volume fractions of P2VP ranging from 0.19 to 0.69. The number average molecular weights for the PtBuSt block and the BCP, the polydispersity indices for the BCP and the $T_g$ for the BCPs, are shown in Table 4. Also shown in Table 5 is the morphology of the post-anneal self-assembled BCP films, including the domain dimensions. (For the lamellae-forming BCP films, the recited dimension corresponds to the height of the lamellae (pitch). For the cylinder-forming BCP films, the recited dimension corresponds to the periodicity of the hexagonal array.)

TABLE 5

| Sample | $M_n$ PtBSt | $M_n$ BCP | PDI BCP | $f_{P2VP}$ | $T_g$ (° C.) | $L_0$ (nm) (morphology) |
| --- | --- | --- | --- | --- | --- | --- |
| 1 | 6.0 | 10.9 | 1.03 | 0.53 | 99, 134 | 17.5 (lamellae) |
| 2 | 6.1 | 7.7 | 1.04 | 0.23 | 98, 128 | 14.2 (P2VP cylinders) |
| 3 | 7.3 | 18.9 | 1.04 | 0.65 | 100, 138 | 26.9 (lamellae) |
| 4 | 17.4 | 40.6 | 1.08 | 0.69 | 102, 147 | 50.2 (lamellae) |
| 5 | 5.3 | 11.5 | 1.04 | 0.56 | 98, 128 | 18.1 (lamellae) |
| 6 | 5.3 | 10.0 | 1.04 | 0.44 | 98, 134 | 17.6 (lamellae) |
| 7 | 7.7 | 11.4 | 1.04 | 0.31 | 101, 136 | 20.2 (P2VP cylinders) |
| 8 | 8.4 | 16 | 1.05 | 0.48 | 100, 142 | 23.2 (lamellae) |
| 9 | 11.9 | 14.9 | 1.04 | 0.19 | 100, 139 | 23.0 (P2VP cylinders) |

The domain spacing (d) of a lamellar diblock copolymer in the strong segregation regime (J. Polym. Sci. Part B: Polym. Phys. 2005, 43, 3685-3694) is related to the statistical segment length (b), degree of polymerization (N) and χ parameter by the following equation $$d = 1.098 * b * N^{2/3} \chi^{1/6}$$

By using the known values for b, d, and N (here the volume degree of polymerization), rearranging the equation allows for an approximation of $\chi$ for the system. This was done for all lamellar forming BCPs and the average $\chi$ determined was 0.3. By further extending this concept to the domain size at different temperatures, the temperature dependence of $\chi$ can be estimated. In this case, $\chi=142.95/T-0.088$ where T is in Kelvin, which yields a $\chi$ of 0.25 at 150° C. (approx. 10° C. above the $T_g$ for PtBS).

Figure 3:
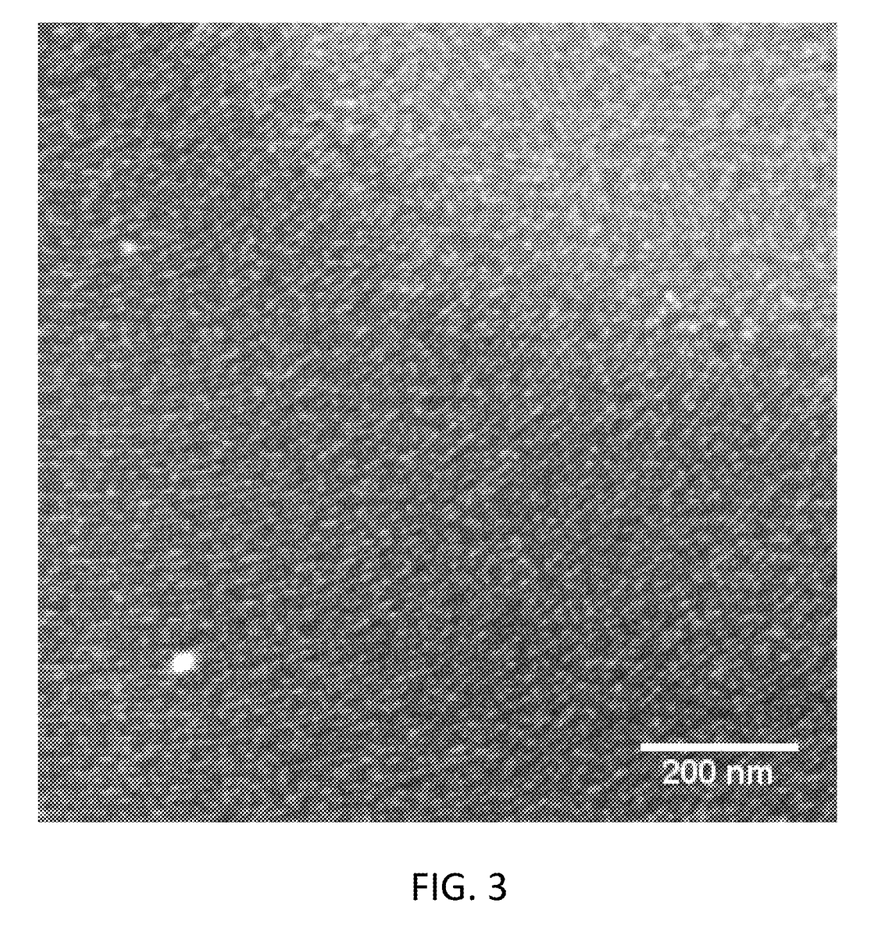
FIG. 3 is an image of a self-assembled film of a cylinder-forming PtBuSt-b-P2VP BCP in accordance with Example 3.
Figure 4:
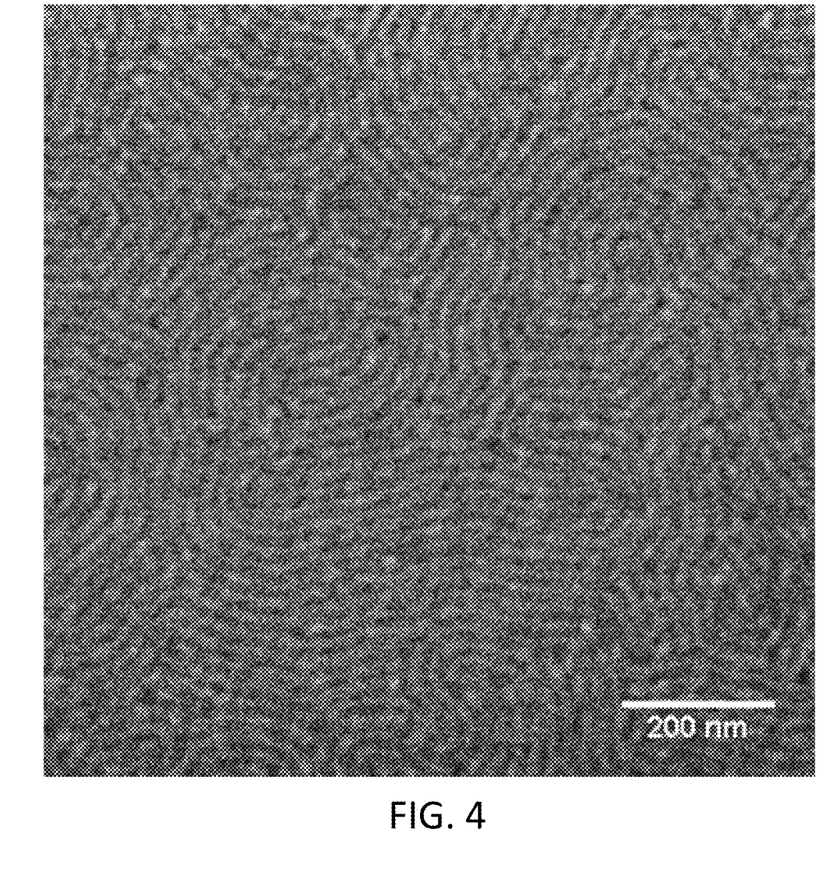
FIG. 4 is an image of a self-assembled film of another cylinder-forming PtBuSt-b-P2VP BCP in accordance with Example 3.

FIGS. 3 and 4 show images of self-assembled films of samples 2 and 9 from Table 5. In both films the P2VP domains formed cylinders oriented parallel to the substrate. The structures were revealed by seeding the P2VP domain with platinum, followed by a selective etch. The cylinder diameter for sample 2 was 6.1±0.7 nm. The cylinder diameter for sample 9 was 11.4±1.3 nm.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of transferring a pattern into a substrate using a PtBuSt-b-P2VP block copolymer, the method comprising:
    depositing the PtBuSt-b-P2VP block copolymer over the substrate and subjecting the PtBuSt-b-P2VP block copolymer to conditions that induce it to self-assemble into a plurality of domains;
    selectively removing some of the domains, such that the self-assembled PtBuSt-b-P2VP block copolymer layer defines a pattern over the substrate; and
    transferring the pattern into the substrate to provide a patterned substrate.
2. The method of claim 1, wherein the plurality of domains includes domains having at least one dimension that is no greater than 100 nm.
3. The method of claim 1, wherein the plurality of domains includes domains having at least one dimension that is no greater than 20 nm.
4. The method of claim 1, wherein the plurality of domains includes domains having at least one dimension that is no greater than 10 nm.
5. The method of claim 4, wherein the plurality of domains comprises cylinders.
6. The method of claim 1, wherein the plurality of domains comprises cylinders.
7. The method of claim 6, wherein the cylinders have diameters of no greater than 100 nm.
8. The method of claim 6, wherein the cylinders are oriented perpendicular with respect to a surface of the substrate.
9. The method of claim 6, wherein the cylinders are oriented parallel with respect to a surface of the substrate.
10. The method of claim 1, wherein the plurality of domains comprises lamellae oriented perpendicular with respect to a surface of the substrate.
11. The method of claim 10, wherein the lamellae have a thickness of no greater than 100 nm.
12. The method of claim 1, wherein the volume fraction of P2VP in the block copolymer is in the range from 0.19 to 0.69.
13. The method of claim 1, wherein transferring the pattern into the substrate to provide a patterned substrate comprises selectively chemically modifying exposed regions of the substrate surface.
14. The method of claim 1, wherein transferring the pattern into the substrate to provide a patterned substrate comprises selectively removing exposed regions of the substrate surface.
15. The method of claim 1, wherein transferring the pattern into the substrate to provide a patterned substrate comprises selectively coating exposed regions of the substrate surface.
16. The method of claim 1, wherein selectively removing some of the domains, such that the self-assembled PtBuSt-b-P2VP block copolymer layer defines a pattern over the substrate comprises seeding the P2VP blocks of the block copolymer with a metal and then etching the P2VP.

* * * * *

UNITED STATES PATENT AND TRADEMARK OFFICE
CERTIFICATE OF CORRECTION

| | |
|---|---|
| PATENT NO. | : 10,913,873 B2 |
| APPLICATION NO. | : 15/404775 |
| DATED | : February 9, 2021 |
| INVENTOR(S) | : Padma Gopalan et al. |

It is certified that error appears in the above-identified patent and that said Letters Patent is hereby corrected as shown below:

In the Specification

Column 1, Line 36:
Delete the phrase "pop," and replace with --$\chi_{BCP}$,--.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*